United States Patent [19]
Bardahl et al.

[11] 4,184,199
[45] Jan. 15, 1980

[54] HEAVY DUTY RECTIFIER

[75] Inventors: Nils Bardahl, Uttenreuth; Günter Kliesch, Bubenreuth, both of Fed. Rep. of Germany

[73] Assignee: Siemens Aktiengesellschaft, Berlin and Munich, Fed. Rep. of Germany

[21] Appl. No.: 933,531

[22] Filed: Aug. 14, 1978

[30] Foreign Application Priority Data

Aug. 31, 1977 [DE] Fed. Rep. of Germany ....... 2739242

[51] Int. Cl.² ........................................... H02M 7/06
[52] U.S. Cl. .................................... 363/141; 357/82; 361/382; 363/144
[58] Field of Search ...................... 357/76, 77, 81, 82; 361/382–385; 363/141, 144

[56] References Cited

U.S. PATENT DOCUMENTS

| | | | |
|---|---|---|---|
| 3,275,856 | 9/1966 | Chumakov | 361/383 X |
| 3,289,068 | 11/1966 | Healis | 363/144 X |
| 3,416,597 | 12/1968 | Kupferberg | 357/82 X |
| 3,435,891 | 4/1969 | Parrish | 357/82 X |
| 3,441,812 | 4/1969 | De Bucs et al. | 357/81 X |
| 3,476,175 | 11/1969 | Plevyak | 357/82 X |
| 3,842,336 | 10/1974 | Galloway | 363/144 X |
| 3,895,285 | 7/1975 | Bardahl et al. | 363/144 X |
| 3,909,678 | 9/1975 | Rifkin et al. | 361/385 |

Primary Examiner—William M. Shoop
Attorney, Agent, or Firm—Kenyon & Kenyon

[57] ABSTRACT

A heavy duty rectifier having rows of rectifier valves disposed on a rectifier bar which is forced circulation cooled is disclosed. A connecting bar is provided for each row of rectifier valves through which current is supplied to the valves. The rectifier valves are mounted on a broadside of the rectifier bar and the connecting bars are mutually spaced from each other and from the broadside of the rectifier bar. Terminals are provided on mutually facing surfaces of the connecting bars which are arranged at right angles to the broadside of the rectifier bar. The exterior surfaces of the rectifier bar define a first shape having a first area and the exterior surfaces of the connecting bars define a second shape having a second area with the first and second shapes and the first and second areas being substantially matched. Preferably the shapes are rectangular. This arrangement reduces the current deviation along the rectifier and connecting bars.

5 Claims, 5 Drawing Figures

HEAVY DUTY RECTIFIER

BACKGROUND OF THE INVENTION

The present invention relates to a heavy duty rectifier which includes rows of rectifier valves secured to a rectifier bar cooled by forced circulation with the valves of a respective row being electrically connected to a respective connecting bar.

In such known heavy duty rectifiers, on one broadside of the rectifier bar are disposed rows of rectifier valves secured in an electrically conducting manner at roughly the same mutual spacing. Each valve is also electrically connected to a connecting bar through which current is supplied to the valves, there being a connecting bar provided for each row of valves. In one heavy duty rectifier, two rows of rectifier valves are provided and two connecting bars in strip form of roughly equal width are provided, each connecting bar being associated with and through which current is supplied to one row of rectifier valves. Mutually spaced terminals are provided on the connecting bars to which a respective rectifier valve is electrically connected. The mutual spacing of the terminals is approximately the same as that of the associated rectifier valves. Both connecting bars are arranged so as to be spaced from each other, with the side on which the terminals are provided being at an angle to the broadside of the rectifier bar being cooled by forced circulation, and to which are secured the rectifier valves.

Such heavy duty rectifiers with a multiplicity of rectifier valves connected in parallel having at least the bar on which are secured the rectifier valves cooled by forced circulation, are commercially available. It is essential in such heavy duty rectifiers that the load on all rectifier valves be as uniform as possible. This uniformity of load on the individual rectifier valves is associated with a uniform current distribution over the entire length of the bars. In the article "Large Numbers of Parallel Connections in Large Silicon Rectifiers" at pages 544 to 549 of the Siemens-Zeitschrift 42 (1968), it is pointed out that the current distribution in the bars depends on the series and shunt inductances of the system in addition to the distribution of the conduction characteristics of the rectifier valves connected in parallel. Series inductance is understood to be the inductance occurring between two adjacent rectifier valves mounted on the rectifier bar. Shunt inductance is the inductance between each rectifier valve and the associated terminal on the connecting bar. The article teaches that an approximately uniform current distribution is obtained when the series to shunt inductance ratio is as small as possible, assuming the series inductance between any two adjacent rectifier valves corresponds to a mean series inductance. Measurements taken on commercial heavy duty rectifiers show that, despite the observance of this requirement, great variations of up to 50% from the mean value occur in the current distribution along the bars.

SUMMARY OF THE INVENTION

It is an object of the present invention to provide an improved heavy duty rectifier of the type having rows of rectifier valves secured in a rectifier bar with the valves of a respective row being electrically connected to a respective connecting bar through which current is supplied to the valves, in which a more uniform current distribution is obtained along the bars in a simple manner.

This and other objects are achieved according to the invention, by spacing the connecting bars which are in strip form sufficiently far apart from each other and selecting the spacing so that the configuration defined by the exterior surfaces of the connecting bars corresponds in shape and area approximately to the configuration defined by the exterior surfaces of the forced circulation cooled rectifier bar, and locating the terminals for electrically connecting the rectifier valves to the connecting bars on the mutually facing inside surfaces thereof.

In the preferred embodiment, the configurations defined by the exterior surfaces of the rectifier bar and connecting bars are rectangular.

In accordance with the invention, the current collecting rectifier bar and the current supplying connecting bars have the same cross-sectional configuration, whereby substantially identical series inductances are obtained in the rectifier bar and the two connecting bars on the one hand, and the series inductances are decreased by the increase of the periphery of the area encompassed by the connecting bars on the other hand. Measurements show that a largely uniform current distribution is thus obtained with smaller deviations from the mean value along the bars.

To increase the shunt inductances and thus decrease the series to shunt ratio, air-core chokes may be disposed according to one aspect of the invention in a part of the electrically conducting connecting between the rectifier valves and the associated connection points. Advantageously such air-core chokes are connected to the rectifier valves located in the vicinity of the two ends of the forced circulation cooled rectifier bar.

According to another aspect of the invention, further equalization of the current distribution may be obtained by connecting the two connecting bars to each other at their upper and lower ends via electrically conducting current-equalizing loops.

These and other aspects of the invention will be more apparent from the following description of the preferred embodiment thereof when considered with the accompanying drawings and appended claims.

BRIEF DESCRIPTION OF THE DRAWINGS

The present invention is illustrated by way of example and not limitation in the figures of the accompanying drawings in which like references indicate similar parts and in which:

FIG. 1a is an elevation view of one side of a prior art heavy duty rectifier;

FIG. 1b is a top plan view of the prior art heavy duty rectifier of FIG. 1a;

FIG. 2a is an elevation view of one side of a heavy duty rectifier according to the invention;

FIG. 2b is a top plan view of the heavy duty rectifier according to the invention of FIG. 2a.

DESCRIPTION OF THE PREFERRED EMBODIMENT

Figures 1A, 1B:
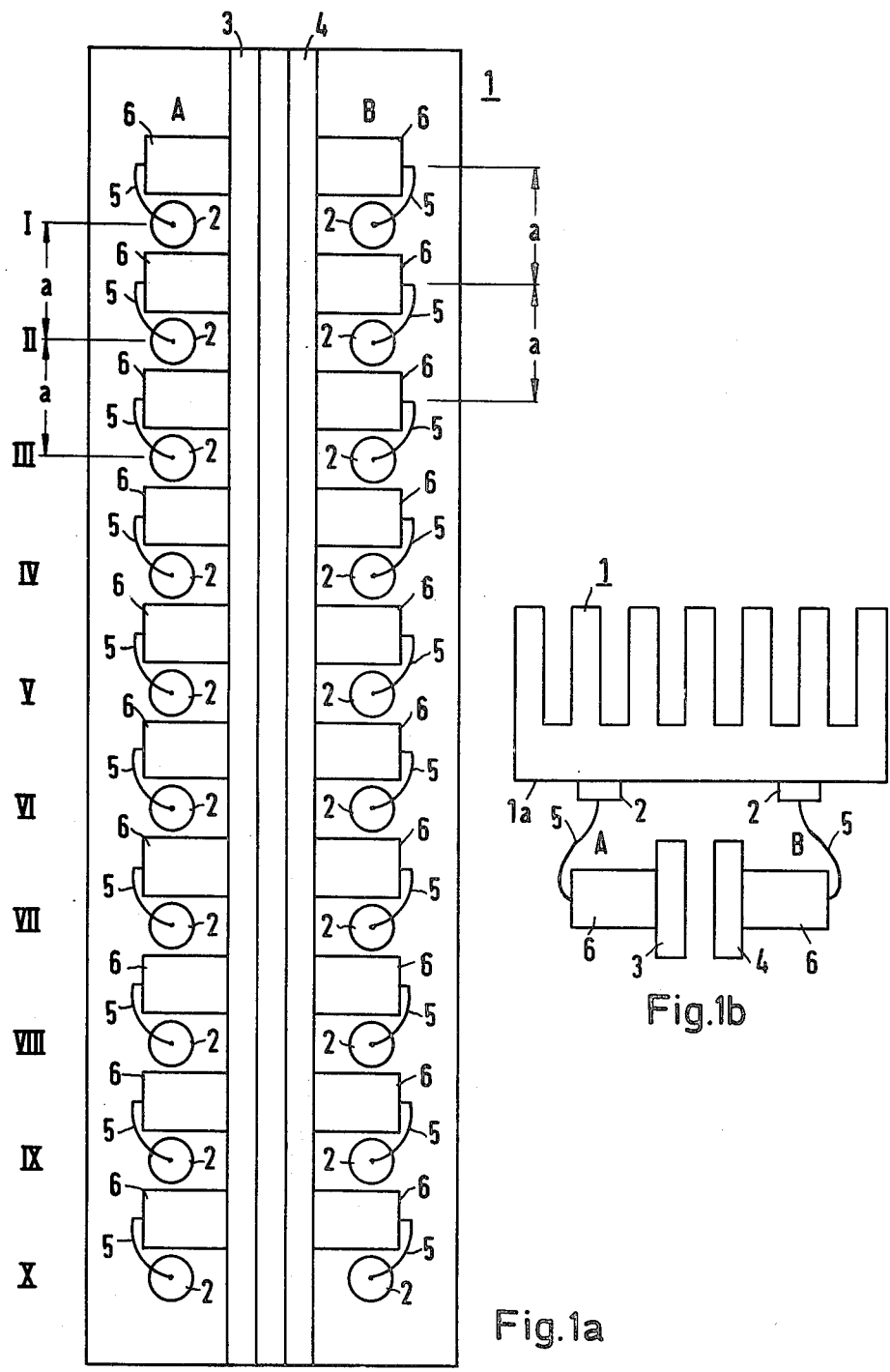

Referring more particularly to the drawings, in FIGS. 1a and 1b is shown a prior art heavy duty rectifier of the type described hereinbefore.

Rectifier bar 1 is cooled by forced circulation, air cooling for example, and rectifier valves 2 are disposed in an electrically conducting manner on the rectifier bar 1 in two rows A and B of 10 rectifier valves each. The rectifier valves 2 may be diodes or thyristors. The mutual spacing of the rectifier valves is the same in each row A or B. Thus, stacks of 10 rectifier valves each are obtained, each level or story of the stack being designated I to X as shown in FIG. 1a.

For each row A,B of rectifier valves 2 is provided a connecting bar 3,4, respectively, in strip form through which current is supplied to the valves. As shown in FIG. 1b, the two connecting bars 3 and 4 are approximately of the same width and are arranged with mutual spacing from and at right angles to the broad side 1a of the rectifier bar 1 on which the rectifier valves 2 are mounted. Each rectifier valve 2 of row A and row B is connected via an electric line 5 to a terminal 6 of the respective connecting bar 3 or 4 associated with the row A or B. In the embodiment shown in FIG. 1a, the terminals 6 are fuses, as is conventional. Accordingly, the terminals of the connecting bars 3 and 4 will hereinafter be referred to as fuses 6. The mutual spacing of the fuses 6 is also the same as that of the rectifier valves 2, i.e. the mutual spacing of the valves is a.

Figure 3:
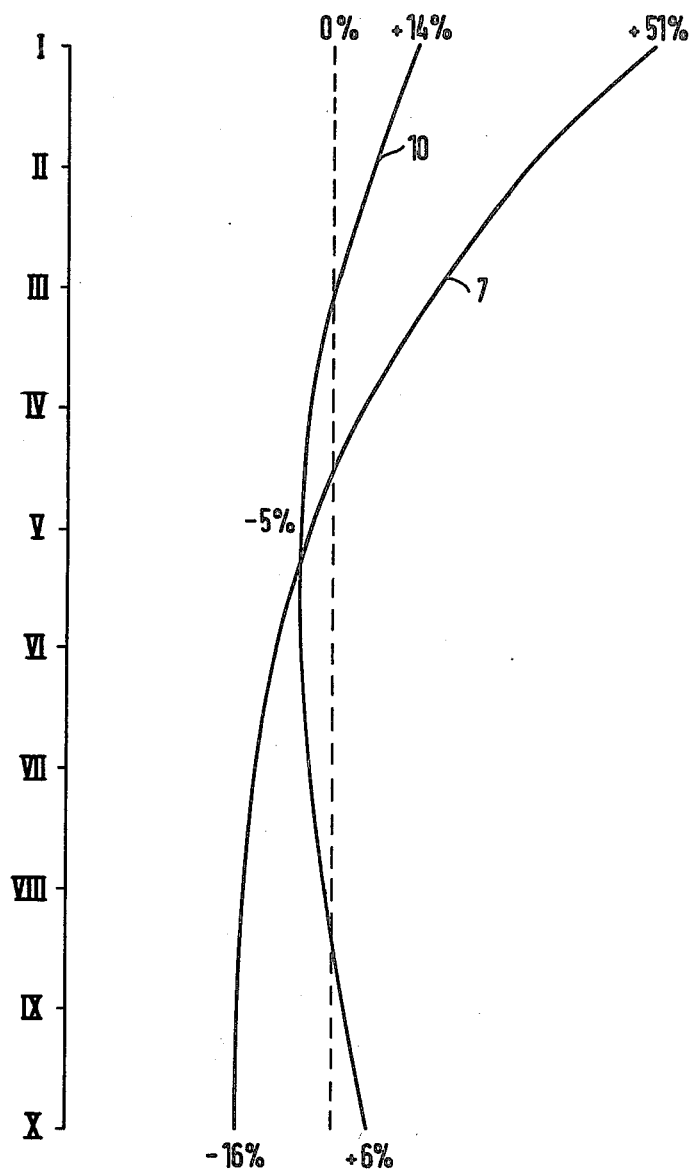
FIG. 3 is plot of the variation of the respective current distributions along the bars of the heavy duty rectifiers of FIGS. 1a, 1b and 2a, 2b.

The current distribution over the levels I to X of the prior art rectifier of FIGS. 1a and 1b is shown in curve 7 of FIG. 3, in which the variations of the current distribution along the bars are plotted in comparison to the mean valve, designated 0%. Curve 7 indicates that the current distribution deviates from the mean by 51% at one end of the stacks and by −16% at the other end. This uneven loading of the rectifier valves 2 may endanger the rectifier valves 2 and may result in damage to them. Alternatively, the heavy duty rectifier may disadvantageously have to be operated below the load limit or ratings of the individual rectifier valves 2.

Figures 2A, 2B:
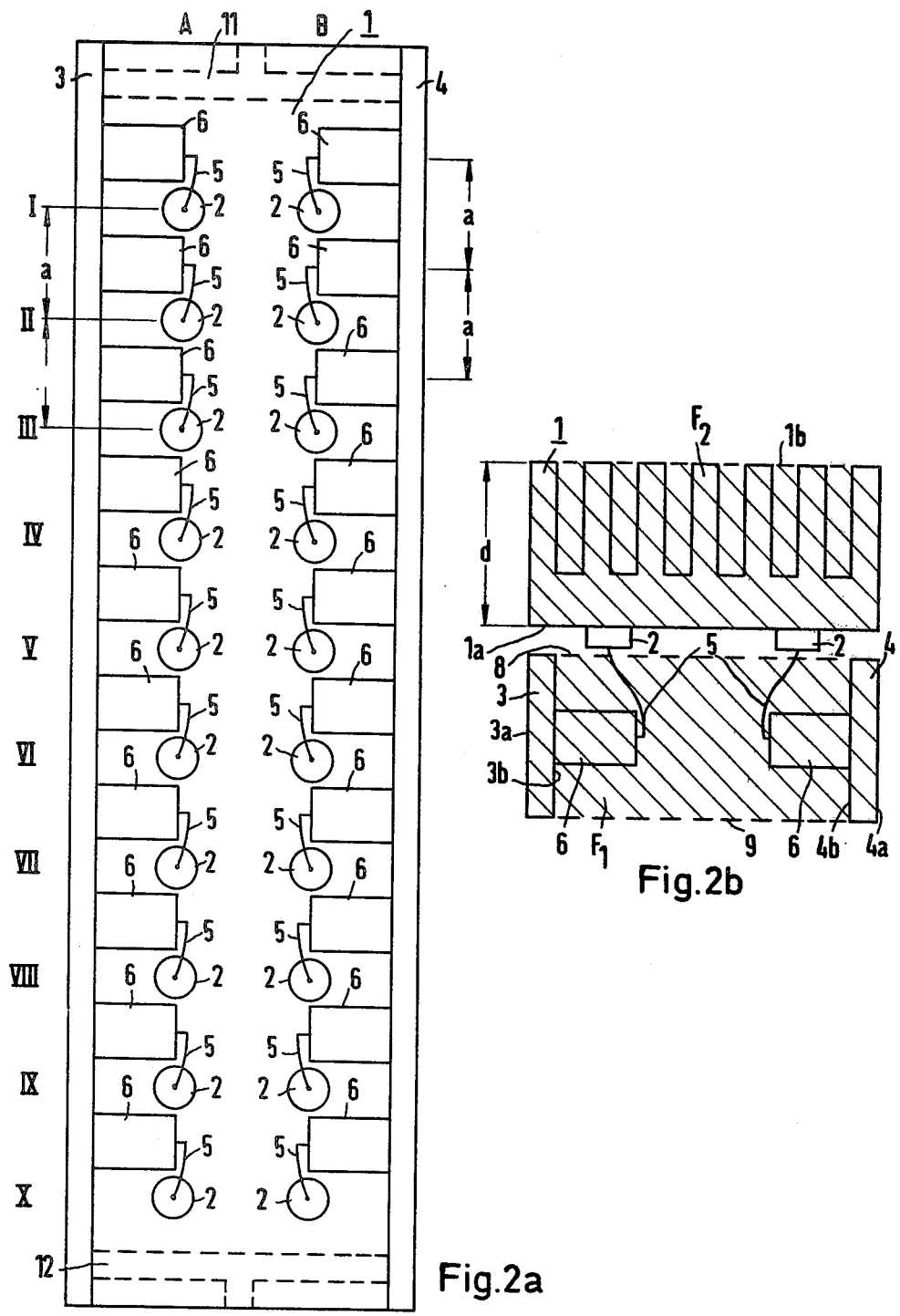

A heavy duty rectifier according to the invention is shown in FIGS. 2a and 2b which is of the general type shown in FIGS. 1a and 1b and in which the exterior surfaces 3a and 4a of the connecting bars 3 and 4 are roughly flush or even with the exterior surfaces of the forced cooled rectifier bar 1. Additionally, the fuses 6 are located on the mutually facing inside surfaces 3b and 4b of the connecting bars 3 and 4, and the connecting bars 3 and 4 are of a width which is roughly equal to the thickness d of the forced cooled rectifier bar 1. In accordance with these features, the area of the rectangle marked $F_1$, formed by the exterior surfaces 3a and 4a and by the dashed lines 8 and 9 connecting the bars, approximately corresponds in shape and area to the rectangle marked $F_2$, which in turn corresponds to the cross-sectional area formed by the dashed line 1b bounding the cooling fins together with the exterior surface of the forced cooled rectifier bar 1. In FIG. 2b, the two rectangles $F_1$ and $F_2$ are hatched for emphasis.

As described, a configuration of the connecting bars and rectifier bar in which the two rectangles $F_1$ and $F_2$ are similar results in the series inductances between the individual stories I to X of both the current collecting and the current supplying bar system being substantially the same and of a reduced value as compared to a conventional design such as the one shown in FIGS. 1a and 1b. Thus a current distribution is obtained as represented by curve 10 which deviates from the mean by a maximum of only +14% and −5% with a deviation at the ends of +14% and +6%. Additionally, since the current distribution deviation from the mean of the heavy rectifier according to the invention is of like sign at both ends of the bar system, the total extent of the deviation along the bar system is reduced. Thus, in accordance with the invention, such a current distribution permits the same rectifier components to be utilized at a higher power rating in the heavy duty rectifier according to the invention.

Further improvement of the current distribution can be achieved in accordance with the invention by the insertion of air-core chokes in the electric connecting lines 5, whereby the shunt inductance is increased and the series to shunt inductance ratio is thus decreased in accordance with the requirements described hereinbefore. The air-core chokes in connecting lines 5 are not shown in the embodiment example for clarity. It should be mentioned, however, that the air-core chokes need not be provided for all connecting lines, but that the current distribution deviations represented by curve 10 of FIG. 3 can be further equalized by disposing the air-core chokes in the vicinity of the bar ends, for example.

Still further improvement of the current distribution can be obtained in accordance with the invention by providing current-equalizing loops 11 and 12 as shown in FIG. 2a in dashed lines which connect the two connecting bars 3 and 4 at the upper and lower end of the bar system in an electrically conducting manner. The current-equalizing loops are not shown in FIG. 2b for clarity. The current equalizing loops 11 and 12 further improve uniformity of current distribution because the current equalizing loops insure a symmetrical distribution of the current to both connecting bars 3 and 4.

It should be pointed out that the areas $F_1$ and $F_2$ need not be rectangular as shown and described for the embodiment of FIGS. 2a and 2b. According to the invention, the configuration of the forced cooled rectifier bar 1 having the area $F_1$, and the configuration of the connecting bars 3 and 4 having an area $F_2$, are matched as closely as possible in shape and area by, for example, appropriate selection of the width of the connecting bars, their spacing and of the angle they form with the broadside 1a of the rectifier bar 1. For example, the areas $F_1$ and $F_2$ may also be trapezoids, rhombi or also asymmetrical rectangles.

The advantages of the present invention, as well as certain changes and modifications of the disclosed embodiments thereof, will be readily apparent to those skilled in the art. It is the applicants's intention to cover by their claims all those changes and modifications which could be made to the embodiments of the invention herein chosen for the purpose of the disclosure without departing from the spirit and scope of the invention.

What is claimed is:

1. A heavy duty rectifier comprising an elongated rectifier member cooled by forced circulation on one broadside thereof, the exterior surfaces of said rectifier member defining a first shape having a first area, two rows of rectifier valves secured to said rectifier member in an electrically conducting manner on said broadside, said rows being mutually equally spaced apart and said rectifier valves being mutually equally spaced, two elongated connecting members having mutually equally spaced terminals secured thereto in an electrically conducting manner on mutually facing surfaces thereof, each connecting member being associated with a respective row of said rectifier valves and a respective rectifier valve being electrically connected to a respective terminal, said connecting members being spaced from each other and from said rectifier member and being disposed at an angle to said broadside of said rectifier member so that exterior surfaces of said spaced connecting members define a second shape having a second area which are substantially the same as said first shape and said first area, respectively.

2. The heavy duty rectifier according to claim 1, wherein the rectifier member and the connecting members are in the form of bars and said first and second shapes are rectangular.

3. The heavy duty rectifier according to claim 2, wherein said connecting members are disposed at a right angle to said broadside.

4. The heavy duty rectifier according to claim 3, and further comprising air chokes electrically connected between at least the rectifier valves disposed proximate the ends of said rows and their associated terminals.

5. The heavy duty rectifier according to claim 3, and further comprising current equalizing loops electrically connected to respective ends of said connecting members.

* * * * *